(12) United States Patent
Basol

(10) Patent No.: US 8,197,703 B2
(45) Date of Patent: *Jun. 12, 2012

(54) METHOD AND APPARATUS FOR AFFECTING SURFACE COMPOSITION OF CIGS ABSORBERS FORMED BY TWO-STAGE PROCESS

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 936 days.

This patent is subject to a terminal disclaimer.

(21) Appl. No.: 12/195,367

(22) Filed: Aug. 20, 2008

(65) Prior Publication Data

US 2009/0035882 A1 Feb. 5, 2009

Related U.S. Application Data

(63) Continuation-in-part of application No. 11/740,248, filed on Apr. 25, 2007, now Pat. No. 7,854,963.

(60) Provisional application No. 60/983,045, filed on Oct. 26, 2007.

(51) Int. Cl.
*B29D 11/00* (2006.01)
*B44C 1/22* (2006.01)

(52) U.S. Cl. .......... 216/24; 216/58; 216/83; 216/88

(58) Field of Classification Search .......... 216/24, 216/58, 83, 88
See application file for complete search history.

(56) References Cited

U.S. PATENT DOCUMENTS

| 4,798,660 A | 1/1989 | Ermer et al. |
| 4,909,863 A | 3/1990 | Birkmire et al. |
| 5,578,503 A | 11/1996 | Karg et al. |
| 5,728,231 A * | 3/1998 | Negami et al. ........... 148/33 |
| 6,048,442 A | 4/2000 | Kushiya et al. |

(Continued)

FOREIGN PATENT DOCUMENTS

DE 10006778 2/2000

OTHER PUBLICATIONS

Olle Lundberg, "Influence of the Cu(In,Ga)Se2 thickness and Ga grading on Solar Cell Performance" Prog. Photovolt: Res. Appl. 2003; vol. 11, Issue 2, pp. 77-88.*

(Continued)

*Primary Examiner* — Shamim Ahmed

(74) *Attorney, Agent, or Firm* — Pillsbury Winthrop Shaw Pittman LLP

(57) ABSTRACT

A method and system to modify a surface composition of thin film Group IBIIIA VIA solar cell absorbers having non-uniformly distributed Group IIIA materials or graded materials, such as Indium (In), gallium (Ga) and aluminum (Al). The graded materials distribution varies between the surface and the bottom of the absorber layer such that a molar ratio of (Ga+Al)/(Ga+Al+In) is the highest at the bottom of the absorber layer and the lowest at the surface of the absorber. Within the bulk of the absorber, the molar ratio gradually changes between the bottom and the surface of the absorber. In one embodiment, the surface composition of a graded absorber layer may be modified by removing a top portion or slice of the absorber layer, where the molar ratio is low so as to expose the inner portions of the absorber layer having a higher molar ratio of graded materials.

8 Claims, 3 Drawing Sheets

U.S. PATENT DOCUMENTS

| | | | |
|---|---|---|---|
| 6,092,669 | A | 7/2000 | Kushiya et al. |
| 6,207,219 | B1 | 3/2001 | Ikeya et al. |
| 6,753,272 | B1 | 6/2004 | Lee et al. |
| 2007/0111367 | A1 | 5/2007 | Basol et al. |
| 2007/0257255 | A1* | 11/2007 | Dhere et al. .......... 257/40 |

OTHER PUBLICATIONS

Abou-Elfotouh, FA, et al., "Studies of the Electrical and Interface Properties of the Metal Contacts to $CuInSe_2$ Single Crystals", *J. Vac. Sci. Technol. A*., 8(4), Jul./Aug. 1990, pp. 3251-3254.

Bhattacharya, R.N., et al., "$CuIn_{1-x}Ga_xSe_2$-based Photovoltaic Cells from Electrodeposited Precursor Films", *Solar Energy Mats & Solar Cells*, vol. 76, 2003, pp. 331-337.

Binsma, J.J., et al., "Preparation of Thin $CuInS_2$ Films via a Two Stage Process", *Thin Solid Films*, 97, 1982, pp. 237-243.

Calixto, M.E., et al., "$CuInSe_2$ Thin Films Formed by Selenization of Cu-In Precursors", *J. of Mats. Sci.*, 33, 1998, pp. 339-345.

Dey, S., et al., "Platinum Group Metal Chalcogenides", *Platinum Metals Rev.*, 48(1), 2004, pp. 16-29.

Fernandez, et al., "Electrodeposited and Selenized ($CuInSe_2$) (CIS) Thin Films for Photovoltaic Applications", *Solar Energy Materials and Solar Cells*,52, 1998, pp. 423-431.

Friedfeld, R., et al., "Electrodeposition of $CuIn_xGa_{1-x}Se_2$ Thin Films", *Solar Energy Mats. & Solar Cells*, 58, 1999, pp. 375-385.

Fritz, H.P., et al., "A New Electrochemical Method for Selenization of Stacked CuIn Layers and Preparation of $CuInSe_2$ by Thermal Annealing", *Thin Solid Films*, 247, 1994, pp. 129-133.

Gabor, et al., "CInSe2 Thin Film Formation by Rapid Annealing of the Elemental Precurso", *Americ. Ins. of Phys*., pp. 236-242, (1992).

Ghosh, B., et al., "A Novel Back-Contacting Technology for $CuInSe_2$ Thin Films", *Semiconduct. Sci. Tech*., 11, 1996, pp. 1358-1362.

Grindle, S.P., et al., "Preparation and Properties of $CuInS_2$ Think Films Produced by Exposing rf-Sputtered Cu-In Films to an $H_2S$ Atmosphere", *Appl. Phys. Lett*, 35(1) Jul. 1, 1979, pp. 24-26.

Guillen, C., et al., "New Approaches to Obtain $CuIn_{1-x}Ga_xSe_2$ Thin Films by Combining Electrodeposited and Evaporated Precursors", *Thin Solid Films*, 323, 1998, pp. 93-98.

Guillen, C.,et al., "$CuInSe_2$ Thin Films Obtained by a Novel Electrodeposition and Sputtering Combined Method," *Vacuum*, 58, 2000, pp. 594-601.

Gupta, A., et al., "$CuInS_2$ Films Prepared by Sulfurization of Electroless Deposited Cu-In Alloy", *Solar Energy Mats.*, 18, 1988, pp. 1-8.

Huang, C.J., et al., "formation of $CuInSe_2$ Thin Films on Flexible Substrates by Electrodeposition (ED) Technique", *Solar Energy Mats. & Solar Cells*, 82, 2004, pp. 553-565.

Kadam, A., et al., "Study of Molybdenum Back Contact Layer to Achieve Adherent and Efficient CIGS2 Absorber Thin-Film Solar Cells", *J. Vac. Sci. Tech. A*., 23(4), Jul./Aug. 2005, pp. 1197-1201.

Kampmann, A., et al., "Electrodeposition of CIGS on Metal Substrates", *Mat. Res. Soc. Symp. Proc*., 763, 2003, pp. B8.5.1-B8.5.6.

Kapur, V.K., et al., "Low Cost Thin Film Chalcopyrite Solar Cells", *IEEE*, 1985, p. 1429-1432.

Kapur, V.K., et al., "Low Cost Methods for the Production of Semiconductor Films for $CuInSe_2$/CdS Solar Cells", *Solar Cells*, 21, 1987, pp. 65-72.

Kim, et al., "Preparation of $CuInSe_2$ Thin Films Using Electrodeposited In/Cu Metallic Layer", *First WCPEC*, Dec. 5-9, 1994, Hawaii, *IEEE*, pp. 202-205.

Kumar, et al., "Properties of $CuInSe_2$ Films Prepared by the Rapid Thermal Annealing Technique", *Thin Solid Films*, 223, 1993, pp. 109-113.

Kerr, et al., "Rapid Thermal Processing of CIS Precursors", IEEE, pp. 676-679, (2002).

Lokhande, C., et al., "Preparation of $CuInSe_2$ and $CuInS_2$ Films by Reactive Annealing in $H_2$ $Se_2$ or $H_2$ S", *Solar Cells*,, 21, 1987, pp. 215-224.

Malmstrom, J., et al., "Enhanced Back Reflectance and Quantum Efficiency in Cu(In,Ga) $H_2$ $Se_2$ Thin Film Solar Cells with ZrN Back Reflector", *Appl. Phys. Letts*., 85(13), Sep. 27, 2004, pp. 2634-2636.

Mooney, et al., "The formation of CuInSe2 Thin Films by Rapid ThermalProcessing", Solar Cell, vol. 30, pp. 69-77, (1991).

Moons, E., et al., "Ohmic Contacts to P-$CuInSe_2$ Crystals", *J. of Electron. Mats*., 22(3), 1993, pp. 275-280.

Nelson, A., et al., "Formation of Schottky Barrier Height of Au Contacts to $CuInSe_2$", *J. Vac. Sci. Technol. A*., 9(3), May/Jun. 1991, pp. 978-982.

Pendorff, et al., "CuInS2 Thin Film Formation on a Cu Tape Substrate for Photovoltaic Applications", Solar Energy Materials and Solar Cells, vol. 53, pp. 285-298 (1998).

Probst, et al., "Advanced Stacked Elemental Layer Process for Cu(InGa)Se2 Thin Film Photovoltaic Devices", MRS Symp. Proc., vol. 426, pp. 165-176, (1996).

Winkler, M., et al. "CISCuT absorber layers—the present model of thin film growth", Thin Solid Films 387 (2001) p. 86-88.

Winkler, et al., "Design Actual Performance and Electrical Stability of CISCuT-Based Quasi Endless Solar Cell Tapes", Mat. Res. Soc. Symp. Proc., vol. 668, pp. H3.11-H311.6, (2001).

Assali, K.E., et al., "Initial Results of CdS/CuInTe2 Heterojunction Formed by Flash Evaporation", *Solar Energy Mats & Solar Cells*, vol. 59, 1999, pp. 349-353.

Basol, B., et al., "Control of CuInSe2 Film Quality by Substrate Surface modifications in a Two Stage Process", *IEEE*, 1991, pp. 1179-1184.

Basol, B., et al., "Cu(ln,Ga)Se2 Thin Films and Solar Cells Prepared by Selenization of Metallic Precursor", *J. Vac. Sci. Technol.*, vol. 14, No. 4, Jul./Aug. 1996, pp. 2251-2256.

Boustani, M., et al., "Structural and Optical Properties of CuInTe2 Films Prepared by Thermal Vacuum Evaporation from a Single Source", *Solar Energy Mats. and Solar Cells*, vol. 45, 1997, pp. 369-376.

Marudachalam, M., et al., "Preparation of homogeneous Cu(InGA)Se2 Films by Selenization of Metal Precursors in H2He Atomsphere", *Appl. Phys. Lett.*, vol. 67, No. 26, Dec. 25, 1995, pp. 3978-3980.

Reddy, M.S., et al., "Investigations on Polycrystalline CuGaTe2 Thin Films", *Thin Solid Films*, vol. 292, 1997, pp. 14-19.

Roy, S., et al., "CuInTe2 Thin Films Synthesized by Graphite Box Annealing of In/Cu/Te Stacked Elemental Layers", *Vacuum*, vol. 65, 2002, pp. 27-37.

* cited by examiner

METHOD AND APPARATUS FOR AFFECTING SURFACE COMPOSITION OF CIGS ABSORBERS FORMED BY TWO-STAGE PROCESS

CLAIM OF PRIORITY

This application is a continuation in part of U.S. Application Serial No. 11/740,248, filed Apr. 25, 2007 entitled "METHOD AND APPARATUS FOR CONTROLLING COMPOSITION PROFILE OF COPPER INDIUM GALLIUM CHALCOGENIDE LAYERS," (now U.S. Pat. No. 7,854,963) and this application also claims priority to U.S. Provisional Application Ser. No. 60/983,045, filed Oct. 26, 2007; which applications are expressly incorporated by reference herein.

FIELD OF THE INVENTIONS

The present inventions relate to method and apparatus for preparing thin films of semiconductor films for radiation detector and photovoltaic applications, specifically to a method and apparatus for processing Group IBIIIA VIA compound layers for thin film solar cells.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIA VIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{(1-x)}Ga_x(S_ySe_{(1-y)})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIA VIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or contact layer, which is previously deposited on the substrate 11 and which acts as the electrical contact to the device. The substrate 11 and the conductive layer 13 form a base 13A on which the absorber film 12 is formed. Various conductive layers comprising Mo, Ta, W, Ti, and stainless steel etc. have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO or CdS/ZnO etc. stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIA VIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. For techniques (such as evaporation) that yield relatively uniform Ga distribution through the thickness of the CIGS absorber layer, the optimum Ga/(Ga+In) molar ratio has been found in the 0.2-0.3 range. It is important for a thin film deposition process to have the capability of controlling both the molar ratio of IB/IIIA, and the molar ratios of the Group IIIA components in the composition. It should be noted that although the chemical formula is often written as $Cu(In,Ga)(S,Se)_2$, a more accurate formula for the compound is $Cu(In,Ga)(S,Se)k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

If there is more than one Group VIA material or element in the compound, the electronic and optical properties of the Group IBIIIA VIA compound are also a function of the relative amounts of the Group VIA elements. For $Cu(In,Ga)(S,Se)_2$, for example, compound properties, such as resistivity, optical bandgap, minority carrier lifetime, mobility etc., depend on the Se/(S+Se) ratio as well as the previously mentioned Cu/(In+Ga) and Ga/(Ga+In) molar ratios. Consequently, solar-to-electricity conversion efficiency of a CIGS(S)-based solar cell depends on the distribution profiles of Cu, In, Ga, Se and S through the thickness of the CIGS(S) absorber. For example, the data in FIG. 2 schematically shows a typical distribution profile for the Ga/(Ga+In) molar ratio for a Cu(In,Ga)Se$_2$ absorber layer formed by a two-stage process involving selenization of a metallic precursor comprising Cu, In and Ga. Examples of such two-stage processes may be found in various publications. For example, U.S. Pat. No. 6,048,442 discloses a method comprising sputter-depositing a stacked precursor film containing a Cu—Ga alloy layer and an In layer to form a Cu—Ga/In stack on a metallic back electrode layer in the first stage of the process, and then reacting this precursor stack film with one of Se and S to form the absorber layer during the second stage of the process. U.S. Pat. No. 6,092,669 describes the sputtering-based equipment for producing such absorber layers.

As stated above, FIG. 2 shows a typical Ga/(Ga+In) molar ratio data taken from a CIGS layer grown by a two-stage process. As can be seen from this figure one problem faced with the selenization type or two-stage processes is the difficulty to distribute Ga through the thickness of the CIGS absorber layer formed after the reaction of the metallic precursor film with Se. The vertical "y" axis in FIG. 2 shows the Ga/(Ga+In) molar ratio in arbitrary units (A.U.). Along the horizontal "x" axis, "0" refers to the surface of the CIGS absorber layer and "t" refers to the location of the "CIGS film/contact layer" interface. In other words the thickness of the CIGS layer of FIG. 2 is about "t" micrometers. It should be noted that the same phenomenon has been observed for films comprising Al also. For example, when two stage techniques were used to grow Cu(In,Al)Se$_2$ (CIAS) films, Al distribution was found to be very similar to the Ga distribution depicted in FIG. 2. Therefore, although CIGS is used as an example to describe certain preferred embodiments, other embodiments may include CIAS layers or CIGAS layers comprising both Ga and Al. Further, the films may comprise Group IB materials other than Cu (such as Ag) and Group VIA materials other than Se (such as S).

As can be seen from FIG. 2 there is hardly any Ga near the surface of the CIGS layer where the junction of the solar cell is made. This surface portion is practically a CIS (CuInSe$_2$) layer with a small bandgap (0.95-1 eV) and consequently solar cells fabricated on such layers display low open circuit voltages (typically in the range of 400-500 mV) and thus lower efficiencies. CIGS layers processed by evaporation techniques and yielding high efficiency solar cells typically have substantially uniform Ga distribution through their thickness and 20-30% Ga near their surface regions. Such devices give open circuit voltage values of over 650 mV, even over 700 mV. It is believed that when a metallic precursor film comprising Cu, In and Ga is deposited first on a base and then reacted with Se, the Ga-rich phases segregate to the film/base interface (or the film/contact interface) because reactions between Ga-bearing species and Se are slower than the reactions between In-bearing species and Se. Therefore, such a process yields compound absorber layers with surfaces that are rich in In and poor in Ga. When a solar cell is fabricated on such an absorber layer, the active junction of the device is formed within the surface region with a low Ga/(Ga+In) ratio as shown in FIG. 2. Therefore, whatever the mechanism of Ga segregation in two-stage processed CIGS layers may be, it is important to develop approaches that yield CIGS films with a surface Ga/(Ga+In) molar ratio in the 0.15-0.30 range.

DETAILED DESCRIPTION

The present inventions provide methods and apparatus to modify a surface composition of thin film Group IBIIIA VIA solar cell absorbers having non-uniformly distributed Group IIIA materials or graded materials. Such absorbers are also called graded absorbers. Indium (In), gallium (Ga) and aluminum (Al) are all graded materials and their distribution varies between the surface and the bottom of the absorber layer in a way which yields a molar ratio of (Ga+Al)/(Ga+Al+In), i.e. the molar ratio of the Ga and Al content of the absorber layer to the total Ga, Al and In content of the absorber layer, that changes from the surface to the bottom of the absorber layer. The above molar ratio is the highest at the bottom of the absorber layer and the lowest at the surface of the absorber. Within the bulk of the absorber, the molar ratio gradually changes between the bottom and the surface of the absorber. In one embodiment, the surface composition of a graded absorber may be modified by removing a top portion or slice of the absorber layer, where the molar ratio is low so as to expose the inner portions of the absorber layer having a higher molar ratio.

The top portion or slice of the absorber layer, which is formed on a base, may be removed using mechanical, chemical, chemical mechanical, electrochemical and electrochemical mechanical processes. In one embodiment, during the material removal, changes in the amount of graded materials may be in-situ measured by a metrology tool. If the base and the absorber layer to be processed are components of a continuous workpiece, certain embodiments may be performed in a roll-to-roll process system, including at least one material remover and at least one metrology unit, as the continuous workpiece is advanced through the roll-to roll system. The roll-to-roll system may have a control system to correlate the amount of movement and material removal rate based on the graded material measurement provided by the metrology unit.

Figure 1:
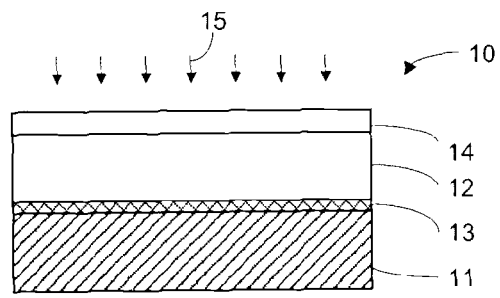
FIG. 1 is a cross-sectional view of a solar cell employing a Group IBIIIA VIA absorber layer.
Figure 2:
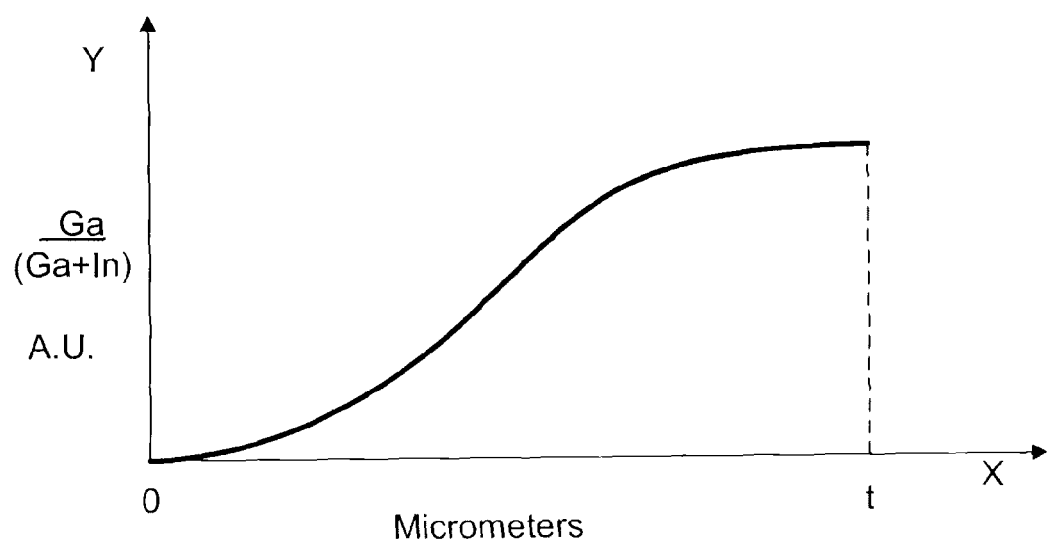
FIG. 2 is graph showing a typical graded Ga/(Ga+In) molar ratio in a CIGS absorber layer obtained by a two-stage process.
Figure 3:
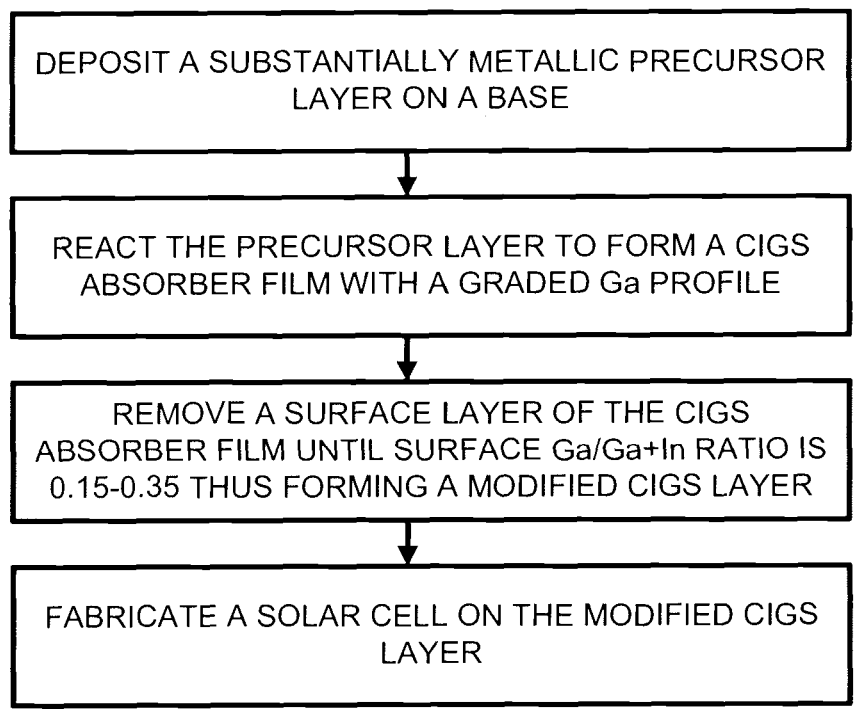
FIG. 3 shows an exemplary process flow chart.

FIG. 3 shows the process steps according to certain embodiments for forming a Cu(In,Ga)Se$_2$ or CIGS absorber layer on a base. The first step of the process is deposition of a precursor layer on a base, the precursor layer being substantially metallic and comprising Cu, In and Ga, i.e. at least 80 molar percent of the constituents of the precursor layer are metallic phases comprising Cu, In and Ga. As an example, the amounts of Cu, In and Ga may be such that Cu/(In+Ga) molar ratio in the precursor layer may be in the range of 0.7-1.0, preferably in the range of 0.8-0.9, and the Ga/(Ga+In) molar ratio may be in the range of 0.35-0.85, preferably in the range of 0.4-0.7. It should be noted that this Ga/(Ga+In) molar ratio range is outside the optimum range of 0.2-0.3 used by the evaporation methods. The reason is that the evaporation methods yield relatively uniform Ga distribution through the thickness of the CIGS layers. In the present method, excess Ga is included to be able to push enough Ga towards the surface region since Ga tends to segregate close to the CIGS/contact layer interface. The precursor layer may be deposited on the base by a variety of techniques such as electrodeposition, evaporation, sputtering, ink deposition etc. The precursor layer may comprise nano particles made of Cu and/or In and/or Ga and/or their mixtures and/or alloys. Alternately, the precursor layer may comprise at least two sub-layers, each sub-layer comprising at least one of Cu, In and Ga. Precursor layer examples include but are not limited to Cu/In/Ga, Cu/Ga/In, Cu/InGa, Cu—Ga/In, Cu—In/Ga, Cu/Ga/Cu/In stacks, etc., where InGa, Cu—In and Cu—Ga refers to mixtures or alloys of In and Ga, Cu and In, and Cu and Ga, respectively. Some impurities such as K, Na, Li etc., may also be present in the precursor layer in an amount less than about 5 molar percent, preferably less than about 1 molar percent. The equivalent thickness of Cu in the precursor layer may be in the range of 100-400 nm. In other words, if all of the Cu content of the precursor layer is calculated, it would be equivalent to a pure Cu layer with a thickness in the range of 100-400 nm. Equivalent thicknesses of In and Ga may then be calculated easily by using the Cu/(Ga+In) and Ga/(Ga+In) molar ratio ranges given above. It should be noted that when such a precursor layer is reacted and a CIGS absorber film is formed, the thickness of the CIGS film would be in the range of about 0.7-3 micrometers (700-3000 nm). For example, for a Cu/(In+Ga) ratio of 0.8 and a Ga/(Ga+In) ratio of 0.5, the CIGS film thickness would be about 727 nm for a Cu equivalent thickness of 100 nm. For the same molar ratios and a Cu equivalent thickness of 400 nm, the CIGS film thickness would be about 2908 nm. As stated above the equivalent thickness of Cu in the precursor layer may be in the range of 100-400 nm, preferably in the range of 150-300 nm, so that the resultant CIGS absorber film thickness is in the range of 1-2 micrometers (1000-2000 nm).

Figure 4A:
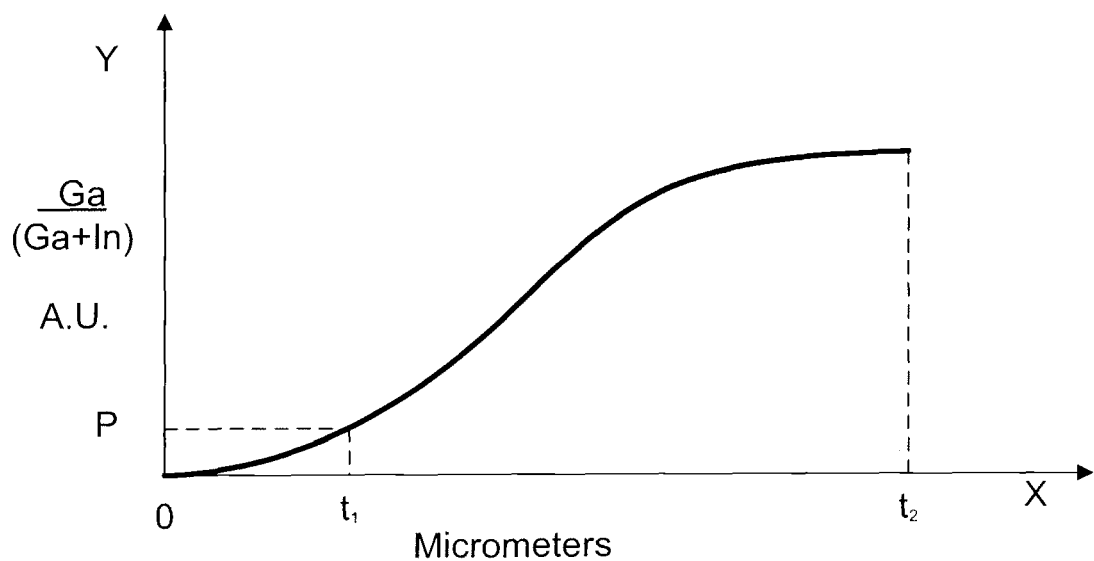
FIG. 4A is a graph showing the Ga/(Ga+In) molar ratio in a CIGS layer that is first processed using a two-stage technique.

Referring back to FIG. 3, the second step of the process involves a reaction step wherein the precursor layer is reacted with Se species. Such selenization may be achieved in various ways. Typically, the reaction step may involve heating the precursor layer to a temperature range of 400-600° C. in the presence of Se provided by sources such as solid or liquid Se, $H_2Se$ gas, Se vapors, etc., for periods ranging from 5 minutes to 1 hour. The Se vapor may be generated by heating solid or liquid sources of Se or by organometallic Se sources, among others. One preferred method involves deposition of a layer of Se over the precursor layer and heating the "base/precursor layer/Se" structure rapidly to the reaction temperature to promote reaction of Cu, In, Ga and Se. Additional Se vapor may also be provided to the structure during this reaction step. As a result of the reaction step of the process a CIGS absorber film with a graded Ga profile is formed on the base (see FIG. 4A). It should be noted that S may also be included in the CIGS absorber film during this reaction step forming a CIGS (S) absorber film. The thickness of the CIGS absorber film is denoted as $t_2$.

Figure 4B:
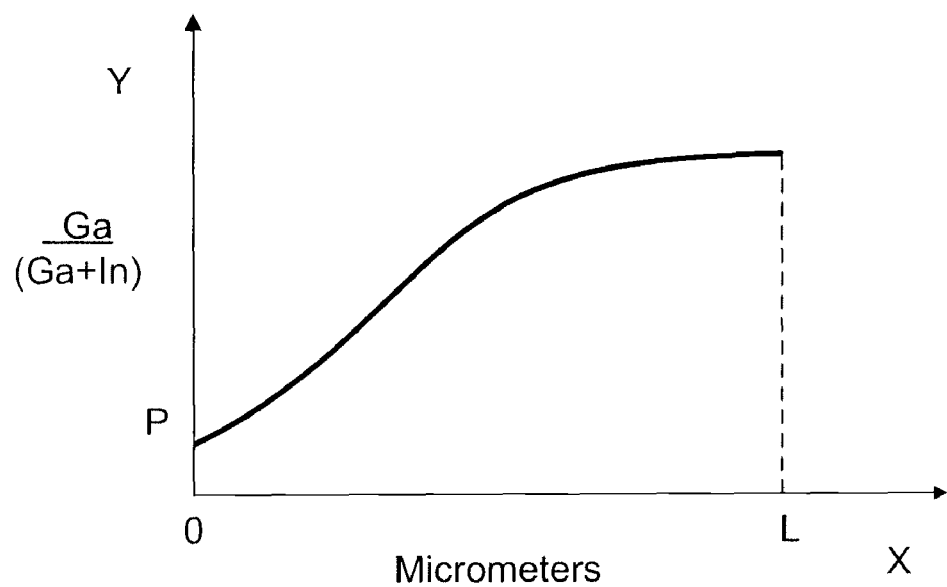
FIG. 4B is a graph showing the Ga/(Ga+In) molar ratio in a CIGS layer which is modified by removal of a portion of a surface region of the absorber layer.

The third step of the process in FIG. 3 involves the removal of a surface slice of the CIGS absorber film with the graded Ga profile thus forming a modified CIGS layer. Referring back to FIG. 4A, the surface slice to be removed may have a thickness of "$t_1$". The Ga/(Ga+In) molar ratio at a location which is "$t_1$" micrometers away from the surface may have a value "P". The preferred value of "P" is in the range of 0.15-0.3. FIG. 4B shows the Ga/(Ga+In) molar ratio through the modified CIGS layer obtained by removing the surface slice with the thickness "$t_1$" from the CIGS absorber film with the thickness "$t_2$". As can be appreciated, the thickness of the modified CIGS layer "L" is approximately equal to ($t_2-t_1$). The Ga/(Ga+In) molar ratio "P" at the surface of the modified CIGS layer is in the range of 0.15-0.3, which is suitable for high voltage solar cell fabrication. The Ga content is graded through the rest of the thickness of the modified CIGS layer of FIG. 4B, establishing a built-in electric field and electron reflector to aid the collection of the minority carriers at the junction that will be next formed on the surface of the modified CIGS layer. It should be noted that the thickness "$t_1$" to be removed is determined, and more preferably predetermined, by the Ga distribution curve in the CIGS absorber film (FIG. 4A) so that when this surface slice is removed a Ga/(Ga+In) ratio of 0.15-0.3 is obtained at the surface of the modified CIGS layer (FIG. 4B).

The removal of the surface slice of the CIGS absorber film may be carried out using various methods. Such methods include but are not limited to mechanical polishing (MP), chemical mechanical polishing (CMP), electrochemical mechanical polishing (ECMP), electropolishing (EP), dry etching and wet etching. For wet etching, for example, an acidic solution comprising bromine (in water or alcohol) may be used. The bromine content may be in the range of 0.01-0.05%. An etchant comprising bromine in water and an acid or salt has been reported to provide a mirror finish surface for $CuInSe_2$ layers (see for example, Birkmire et al., U.S. Pat. No. 4,909,863). This solution may also be used in conjunction with mechanical abrasion (CMP process).

Fabrication of a solar cell on the modified CIGS layer follows. The solar cell may be fabricated by first depositing a thin (~50-100 nm) sulfide buffer layer such as a CdS buffer layer or an In-sulfide buffer layer on the polished and exposed top surface of the modified CIGS layer. This may then be followed by a deposition step to coat the buffer layer surface with a transparent conductive oxide such as zinc oxide (ZnO), indium tin oxide (ITO) or indium zinc oxide (IZO) or a stack of combinations of such oxides. The sulfide buffer layer is traditionally deposited by a chemical dip method and the transparent conductive oxides are deposited by sputtering. Finger patterns may then be formed on the transparent conductive oxide to complete the solar cell.

Figure 5:
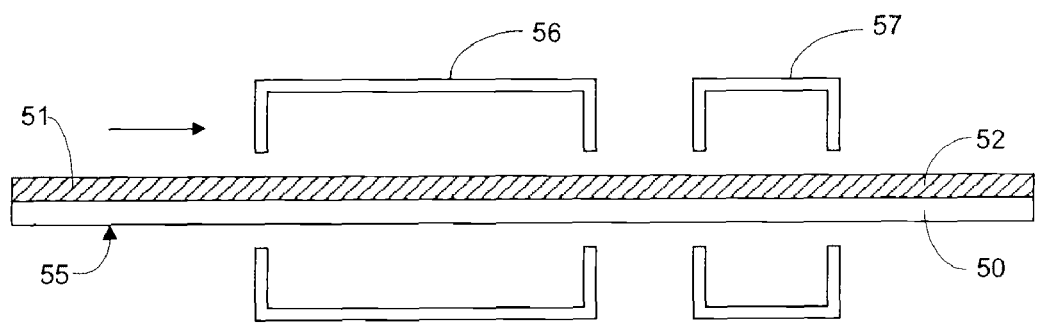
FIG. 5 is a schematic of an in-line or roll to roll process according to one embodiment.

The processes of the embodiments described may be carried out in an in-line or roll-to-roll fashion, continuously, using an exemplary apparatus shown in FIG. 5. In one embodiment, a continuous workpiece 55 may be moved through at least one material removal station 56 which may include at least one material removing apparatus such as CMP, ECMP, MP, and EP units and the like. The continuous workpiece 55 comprises a base 50 on which a CIGS absorber film 51 with a graded Ga profile is previously formed. As portions of the workpiece is moved through the removal station 56 by a moving mechanism (not shown), a slice of material is removed from the CIGS absorber film 51 forming a new structure comprising a modified CIGS layer 52 on the base. One or more metrology units 57 may also be employed to measure the surface Ga content of the modified CIGS layer 52 to confirm that the Ga/(In+Ga) molar ratio is at the specified value within the window of 0.15 to 0.3. Methods such as photoluminescence using a photoluminescence detector, X-ray fluorescence using a X-ray fluorescence detector and the like may be used by the metrology units 57. Metrology units 57 may be within the removal station 56 or outside the removal station and within a metrology station (not shown) for in-situ measurements. Two or more removal stations and two or more metrology stations may also be used to assure that the surface Ga content of the modified CIGS layer is at a target value. A control system (not shown) may operate the moving mechanism, the material removal units and the metrology units. In one embodiment, the control system may control the material removal rate from a portion of the absorber by continuously analyzing the surface of that portion. As the Ga/(In+Ga) molar ratio approaches the specific window of 0.15 to 0.3. The control system advances the continuous workpiece so that a following absorber portion is processed as in the same manner.

Although the present inventions are described with respect to certain preferred embodiments, modifications thereto will be apparent to those skilled in the art.

What is claimed is:

1. A method of forming solar cell absorbers on a surface of a base, comprising:
    forming a precursor layer on the surface of the base, the precursor layer comprising at least one Group IB material, a first Group IIIA material and a second Group IIIA material;
    reacting the precursor layer with a Group VIA material to form a Group IBIIIAVIA absorber layer with a first thickness having a front surface and a back surface adjacent the surface of the base, wherein the step of reacting non-uniformly distributes the second Group IIIA material within the Group IBIIIAVIA absorber layer so that a molar ratio of the second Group IIIA material to a total of the first Group IIIA material and the second Group IIIA material is less than 0.1 at the front surface and greater than 0.5 at the back surface; and
    applying a material removal process to the front surface of the Group IBIIIAVIA absorber layer, thus forming a modified front surface while reducing the thickness of the absorber layer to a second thickness, wherein the molar ratio of the second Group IIIA material to the total of the first Group IIIA material and the second Group IIIA material is in the range of 0.15-0.3 at the modified front surface.

2. The method of claim 1, wherein the first thickness is in the range of 1000-3000 nm, and the second thickness is in the range of 700-2500 nm.

3. The method of claim 1, wherein the Group IB material comprises at least one of copper and silver.

4. The method of claim 3, wherein the first Group IIIA material comprises indium and the second Group IIIA material comprises at least one of gallium and aluminum.

5. The method of claim 4, wherein the Group VIA material comprises selenium.

6. The method of claim 5, wherein the Group VIA material further comprises sulfur.

7. The method of claim 4 wherein the step of reacting comprises the steps of depositing a layer of Group VIA material over the precursor layer thus forming a stack and raising the temperature of the stack to a temperature range of 400-600° C.

8. The method of claim 1, wherein the step of applying the material removal process further comprises analyzing the absorber layer while the thickness of the absorber layer is reduced.

* * * * *